United States Patent
Goel et al.

(10) Patent No.: US 11,068,633 B2
(45) Date of Patent: Jul. 20, 2021

(54) FAULT DIAGNOSTICS

(71) Applicant: Taiwan Semiconductor Manufacturing Company, Ltd., Hsinchu (TW)

(72) Inventors: Sandeep Kumar Goel, Hsinchu (TW); Ankita Patidar, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/545,624

(22) Filed: Aug. 20, 2019

(65) Prior Publication Data

US 2020/0072901 A1 Mar. 5, 2020

Related U.S. Application Data

(60) Provisional application No. 62/725,759, filed on Aug. 31, 2018.

(51) Int. Cl.
*G06F 30/00* (2020.01)
*G06F 30/333* (2020.01)
*G06F 30/33* (2020.01)
*G06F 30/39* (2020.01)
*G06F 30/392* (2020.01)

(52) U.S. Cl.
CPC ............ *G06F 30/333* (2020.01); *G06F 30/33* (2020.01); *G06F 30/39* (2020.01); *G06F 30/392* (2020.01)

(58) Field of Classification Search
CPC ...... G06F 30/333; G06F 30/39; G06F 30/392; G06F 30/33
See application file for complete search history.

(56) References Cited

U.S. PATENT DOCUMENTS

| 8,120,939 | B2 * | 2/2012 | Liaw | H01L 27/0207 |
| | | | | 365/104 |
| 9,286,969 | B2 * | 3/2016 | Agarwal | G11C 11/419 |
| 9,318,476 | B2 * | 4/2016 | Chen | H01L 27/088 |
| 10,467,374 | B2 * | 11/2019 | Peng | G06F 30/367 |
| 2020/0019673 | A1 * | 1/2020 | Peng | G06F 30/367 |
| 2020/0058660 | A1 * | 2/2020 | Chang | H01L 27/11206 |

FOREIGN PATENT DOCUMENTS

| CN | 104246986 A | 12/2014 |
| TW | 378394 A | 1/2000 |

* cited by examiner

*Primary Examiner* — Naum Levin
(74) *Attorney, Agent, or Firm* — Merchant & Gould P.C.

(57) ABSTRACT

Process for determining defects in cells of a circuit is provided. A layout of a circuit is received. The layout comprises a first cell and a second cell separated by a boundary circuit. Bridge pairs for the first cell and the second cell is determined. The bridge pairs comprises a first plurality of boundary nodes of the first cell paired with a second plurality of boundary nodes of the second cell. Bridge pair faults between the bridge pairs are modeled. A test pattern for the bridge pair faults is generated.

20 Claims, 12 Drawing Sheets

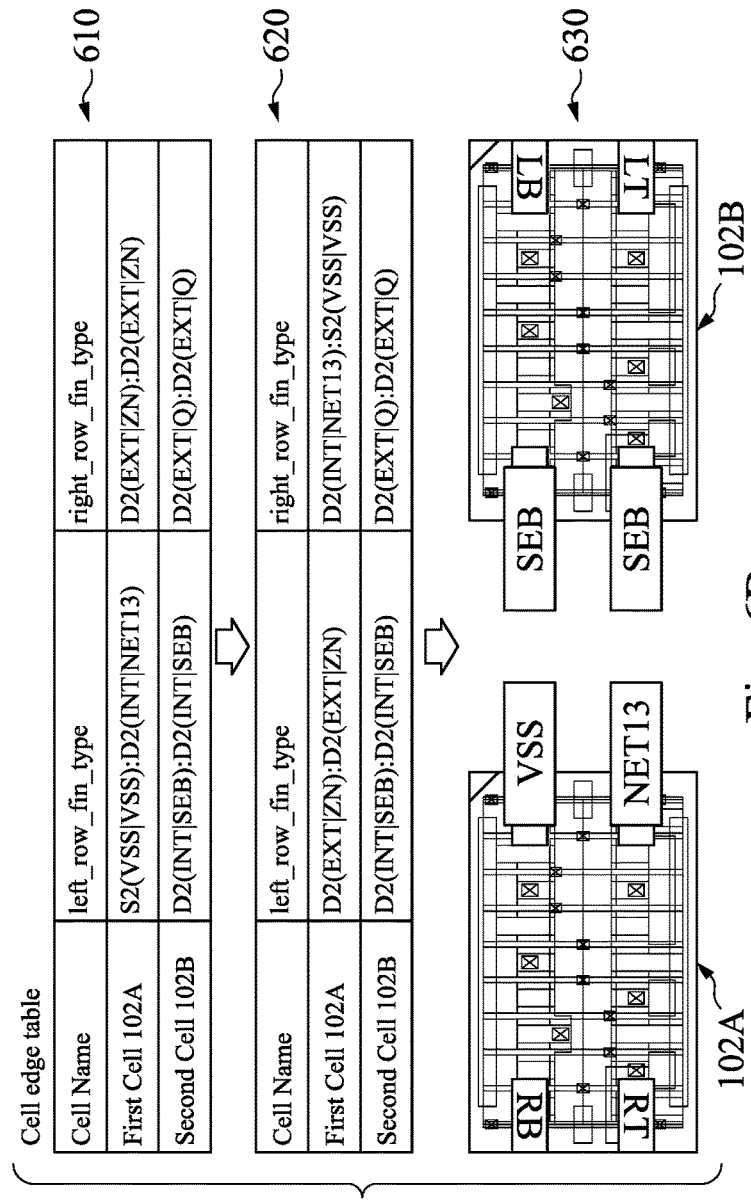

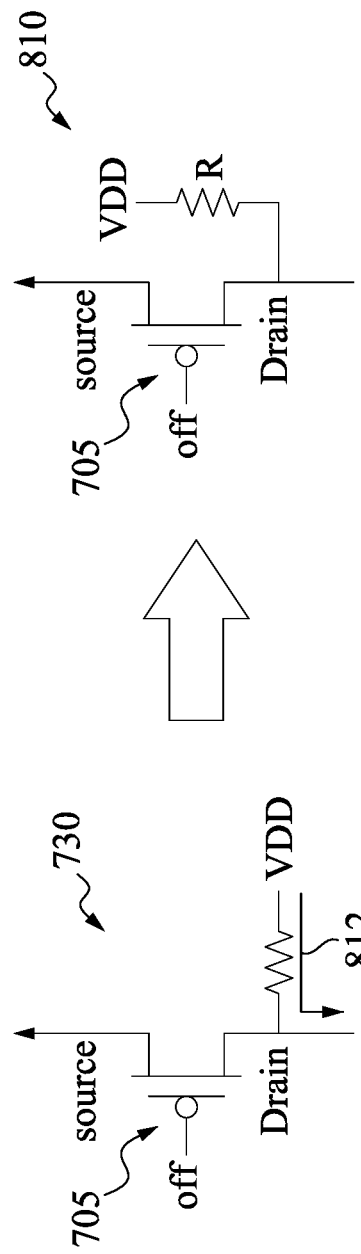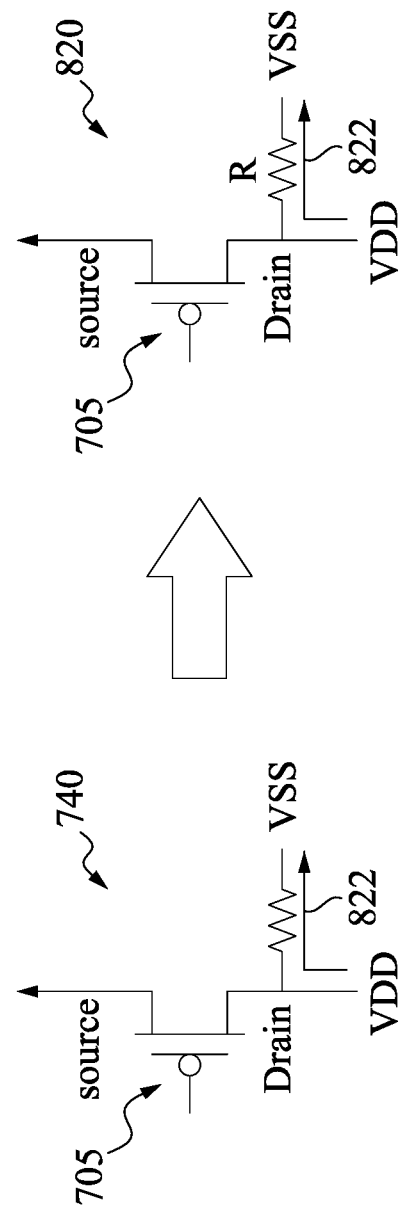
Fig. 8A
Fig. 8B

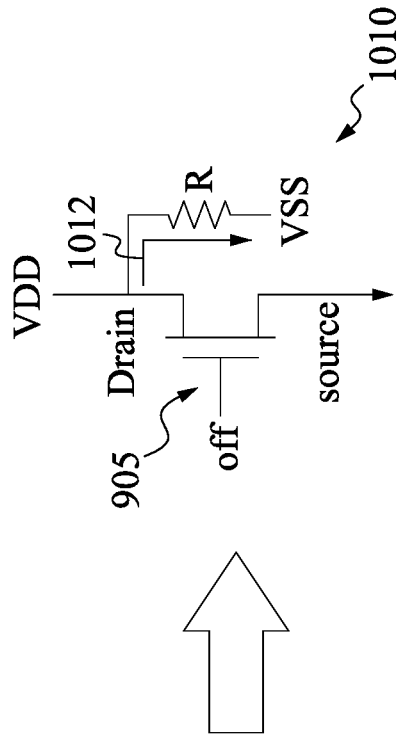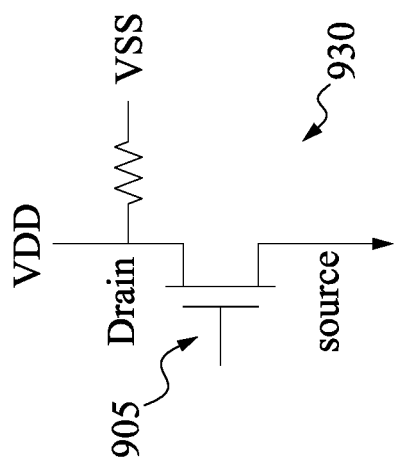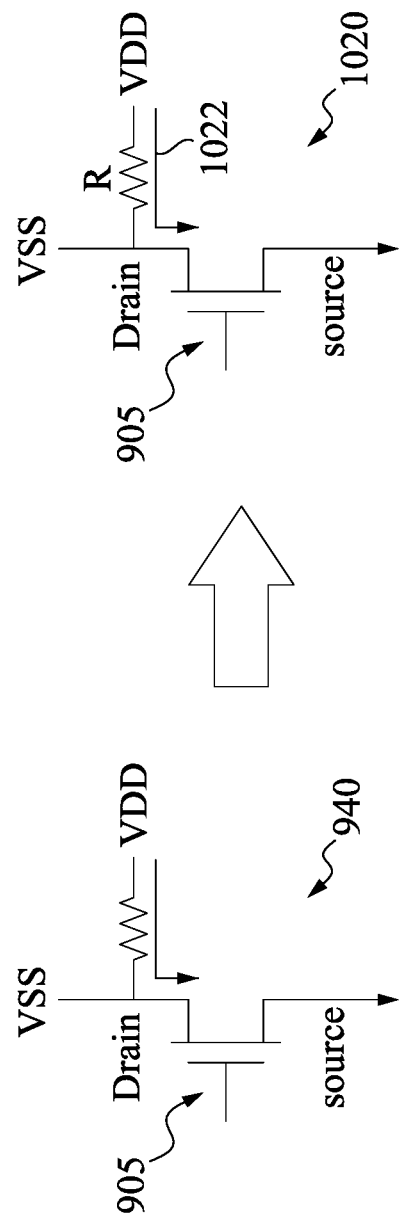
Fig. 10A
Fig. 10B

001 # FAULT DIAGNOSTICS

PRIORITY CLAIM AND CROSS-REFERENCE

This application claims priority to U.S. Provisional Patent Application No. 62/725,759 titled "Fault Diagnostics" filed Aug. 31, 2018, the disclosure of which is hereby incorporated by reference in its entirety.

BACKGROUND

Larger and more complex logic designs in integrated circuits (ICs) lead to demand for more sophisticated testing to ensure fault-free performance of the resulting ICs. This testing can represent a significant portion of the design, manufacture, and service cost of ICs. In a simple model, testing of an IC design includes applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

The test patterns are generated using Automatic Test Pattern Generation (ATPG). ATPG is an electronic design automation method/technology used to find a test pattern that, when applied to a circuit, enables automatic test equipment to distinguish between correct circuit behavior and faulty circuit behavior caused by defects. However, boundary transistor defects in circuits formed using Continuous Oxide Diffusion (CNOD) are difficult to detect using ATPG.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A illustrates an example bridge pair of a circuit, in accordance with some embodiments.

FIG. 6B illustrates an example cell edge table for the example bridge pair of a circuit, in accordance with some embodiments.

FIG. 6C illustrates an example bridge fault of a circuit, in accordance with some embodiments.

FIGS. 8A and 8B illustrates modeling for the bridge faults corresponding to FIGS. 7C and 7D respectively, in accordance with some embodiments.

FIGS. 10A and 10B illustrates modeling for the bridge faults corresponding to FIGS. 9C and 9D respectively, in accordance with some embodiments.

DETAILED DESCRIPTION

Figure 1:
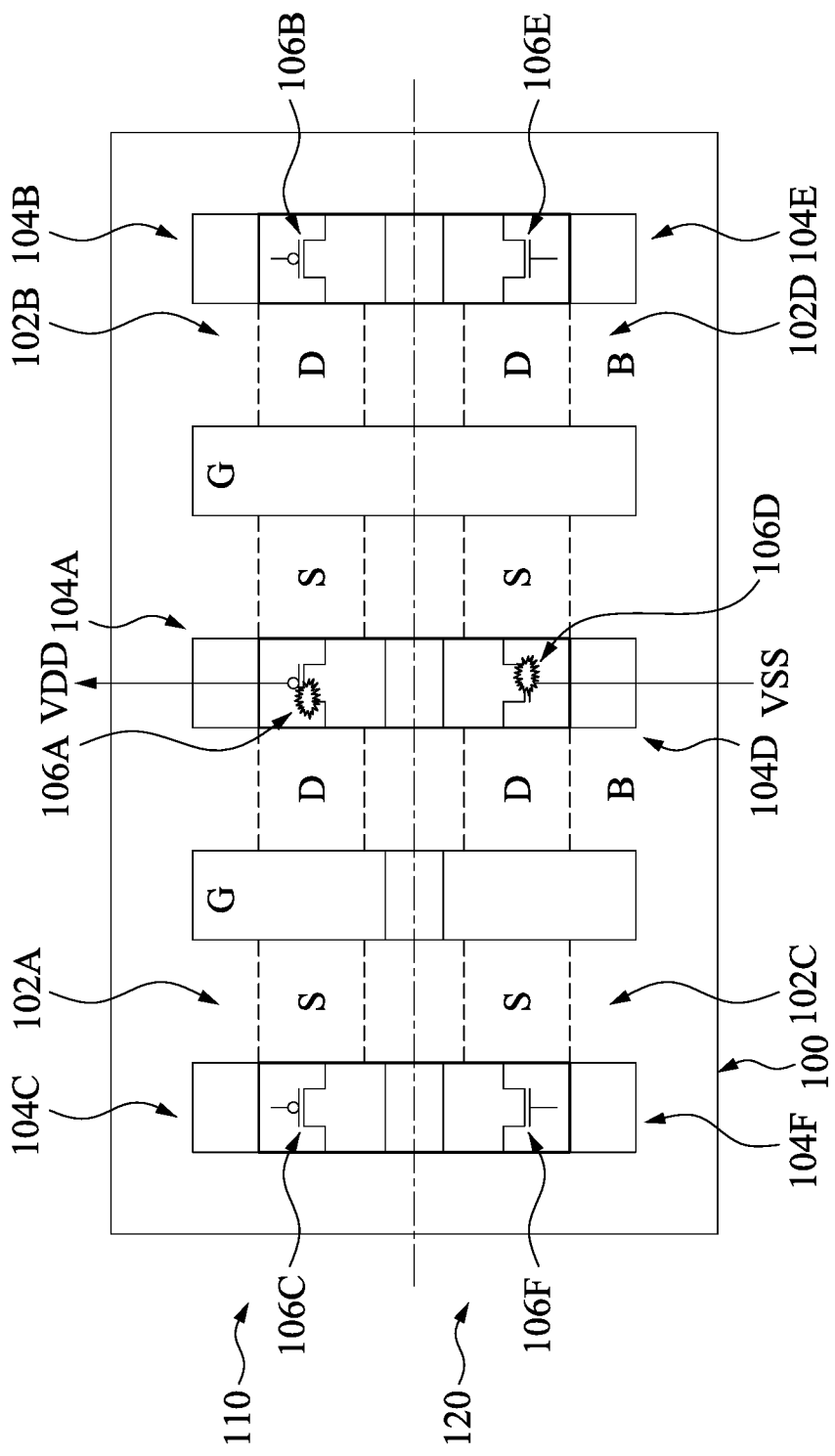
FIG. 1 illustrates an example operating environment in which methods and systems disclosed herein is implemented, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor circuits may include several transistor cells arranged in a predefined pattern. For example, in the case of Field Effect Transistor (FET) circuits, several source/drain pairs are fabricated on a substrate and a corresponding gate electrode are formed over the source/drain pair. Adjacent cells of such semiconductor circuits may experience a leakage at the edge of cell. One type of semiconductor circuit that experiences leakage is a continuous oxide diffusion (CNOD) semiconductor circuit.

In a CNOD semiconductor circuit, adjacent cells experience the leakage currents associated with other types of semiconductor circuits as well as an additional leakage at the edges of the cells because of the continuous nature of the oxide diffusion region. For example, a CNOD semiconductor circuit includes a continuous active region where the source and drain of multiple semiconductor cells are formed. The active region may be a continuous oxide diffusion substrate. As a result of this structure, the separation between adjacent cells is accomplished by doping the oxide diffusion layer to form a boundary circuit. In some instances, there may not be any physical separation between adjacent cells. The additional leakage experienced by the CNOD semiconductor circuit varies depending on the cell boundary conditions (e.g., whether the edge of the cell is a source-source boundary, a source-drain boundary, or a drain-drain boundary, different filler regions, and/or different voltage thresholds). Embodiments of the disclosure provides processes for generating test patterns for detecting faults experienced because of the leakage experienced in a CNOD semiconductor circuit.

FIG. 1 illustrates an example CNOD circuit 100. Circuit 100 may be an Integrated Circuit (IC) or part of an IC. Circuit 100 includes a first cell 102A, a second cell 102B, a third cell 102C, and a fourth cell 102D. A first portion 110 of circuit 100 illustrates a PMOS cell abutment scenario and second portion 120 illustrates a NMOS abutment scenario. For example, in first portion 110 of circuit 100, drain (D) of first cell 102A abuts source (S) of second cell 102B. Similarly, in second portion 110 of circuit 100, drain (D) of third cell 102C abuts source (S) of fourth cell 102D. Cell abutment scenarios are also referred to as bridge pairs. Although FIG. 1 illustrates drain (D) of one cell abutting source (S) of another, it will be apparent to a person with skill in the art after reading this disclosure, and as disclosed in the following portions of the disclosure, that other abutment scenarios are possible.

Each of first cell 102A and second cell 102B is separated from each other and other cells of circuit 100 via a boundary circuit which may include one or more boundary circuits. For example, circuit 100 further includes a first boundary circuit 104A, a second boundary circuit 104B, and a third boundary circuit 104C, a fourth boundary circuit 104D, a fifth boundary circuit 104E, and a sixth boundary circuit 104F (also referred to as boundary circuits 104). First boundary circuit 104A separates first cell 102A from second cell 102B. Similarly, third boundary circuit 104C separates first cell 102A from another neighboring cell (now shown). Additionally, second boundary circuit 104B separates second cell 102B from another neighboring cell (not shown). Moreover, fourth boundary circuit 104D separates third cell 102C from fourth cell 102D. Similarly, sixth boundary circuit 104F separates third cell 102C from another neighboring cell (now shown). Additionally, fifth boundary circuit 104E separates second cell 102B from another neighboring cell (not shown).

Each of boundary circuits 104 include one or more transistors. For example, first boundary circuit 104A includes a first transistor 106A, second boundary circuit 104B includes a second transistor 106B, third boundary circuit 104C includes a third transistor 106C, fourth boundary circuit 104D includes a fourth transistor 106D, fifth boundary circuit 104E includes a fifth transistor 106E, and sixth boundary circuit 104F includes a sixth transistor 106F. As shown in FIG. 1, each of first transistor 106A, second transistor 106B, and third transistor 106C are PMOS transistors and each of fourth transistor 106D, fifth transistor 106E, and sixth transistor 106F are NMOS transistors.

In example embodiments, first transistor 106A, second transistor 106B, third transistor 106C, fourth transistor 106D, fifth transistor 106E, and sixth transistor 106F (collectively referred to as boundary transistors 106) are formed to disable leakage current (that is, to disable flow of signals) between neighboring cells. For example, first transistor 106A to isolate flow of signals from first cell 102A to second cell 102B or from second cell 102B to first cell 102A.

In example embodiments, boundary transistors 106 are biased to disable flow of signals through them. For example, each of PMOS transistors, that is, first transistor 106A, second transistor 106B, and third transistor 106C is connected to a power source (i.e., VDD) to disable flow of signals through it. Similarly, each of NMOS transistors, that is, fourth transistor 106D, fifth transistor 106E, and sixth transistor 106F is connected to ground (i.e. VSS) to disable flow of signals through it. However, due to defects in the formation, boundary transistors 106 may not be fully disabled. For example, if one or more of boundary transistors 106 are not properly disabled, then signals may flow through it creating a bridge fault between neighboring cells, for example, first cell 102A and second cell 102B may be created.

The formation of a bridge fault between neighboring cells leads to signal leak from one or more nodes of first cell 102A to corresponding nodes of second cell 102B. For example, each of first cell 102A and second cell 102B include one or more boundary nodes, that is, nodes facing boundary transistors 106. The bridge fault between neighboring cells, therefore, causes formation of a bridge between boundary nodes of neighboring cells.

In example embodiments, the boundary nodes are classified as internal nodes, external nodes, or power ground (PG) nodes. Internal nodes are nodes that are located within a cell, for example, a source and a drain. On the other hand, external nodes are nodes that are located outside of a cell, for example, input/output (I/O) pins. Accordingly, bridge pairs may include, for example, one or more of external node to external node bridge, external node to PG node bridge, internal node to PG node bridge, internal node to internal node bridge, and internal node to external node bridge.

Processes disclosed herein provide modeling of bridge faults between neighboring cells, for example, between first cell 102A and second cell 102B and between third cell 102C and fourth cell 102D, as cell-level standalone fault for Automatic Test Pattern Generation (ATPG) for fault detection. For example, bridge pair information is extracted from layout reports of the neighboring cells. Then, from the extracted bridge pair, bridge faults between the neighboring cells are modeled as a cell-level standalone leakage faults. That is, the bridge fault at the boundary nodes of the neighboring cells is modeled as a resistive bridge to the VDD and resistive bridge to the VSS. A test pattern is generated for the modeled bridge faults. Next, defects are detected based on the generated test pattern. One or more fillers cells are included when the defect detection is below a predetermined range. Hence, the processes disclosed herein are independent of combination of cell pairs abutted together in a layout.

Figure 2:
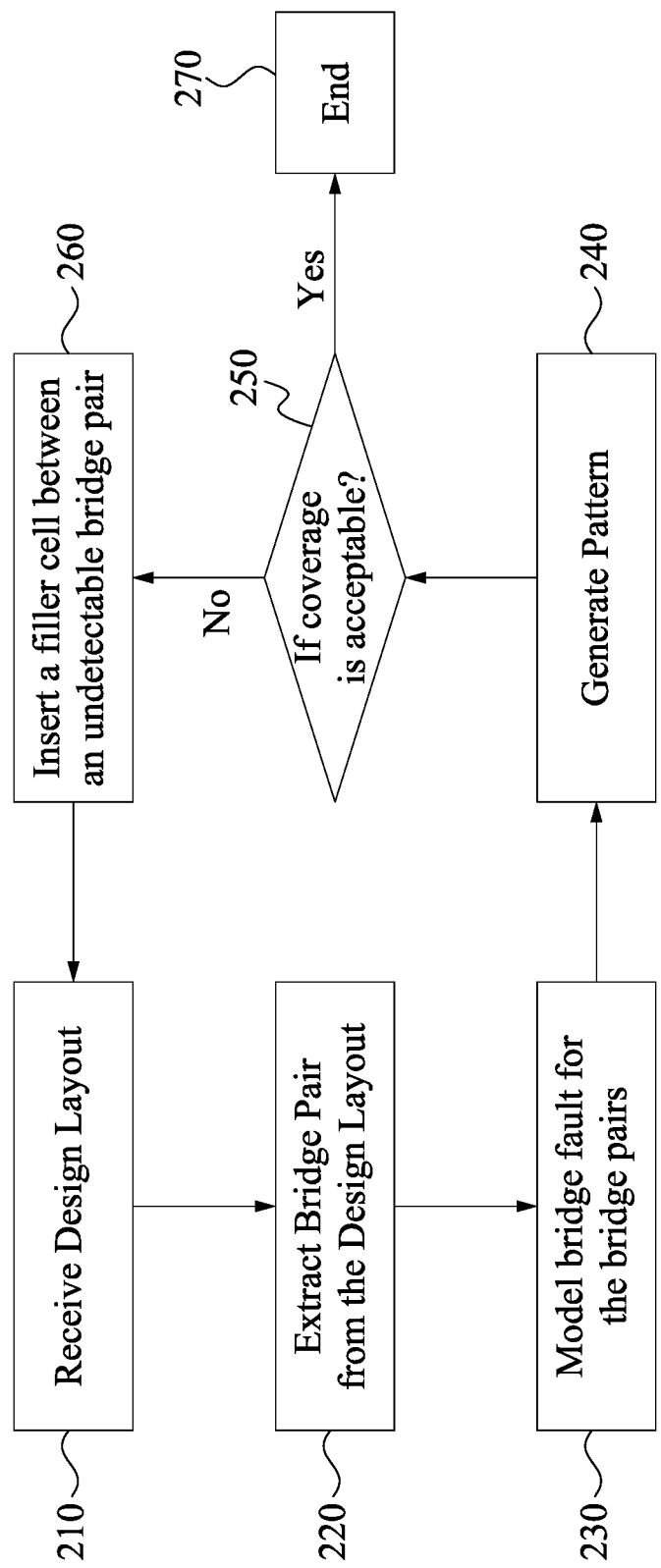
FIG. 2 illustrates a flow diagram of an example method for determining defect in a circuit, in accordance with some embodiments.

FIG. 2 illustrates a flow diagram of a method 200 for generating a test pattern for detecting defects in neighboring cells of a CNOD circuit, in accordance with some embodiments. For example, method 200 is implemented to generate test patterns for bridge faults in circuit 100 described with reference to FIG. 1. Method 200 can be implemented using a computing device, for example, computing device described with reference to FIG. 12. Ways to implement method 200 will be described in greater detail below.

At block 210 of method 200, a design layout is received. The design layout is received from a graphic database system (GDS). The GDS is a storage for design layouts for cells of circuit 100. The design layout, for example, may include placement information of cells, types of cells, orientation information of cells, etc. For example, the design layout of circuit 100 includes the placement information for each of first cell 102A, second cell 102B, third cell 102C, and fourth cell 104D, the placement information for each of a first boundary circuit 104A, a second boundary circuit 104B, a third boundary circuit 104C, fourth boundary circuit 104D, fifth boundary circuit 104E, and sixth boundary circuit 104F of circuit 100. In addition, the design layout of circuit 100 may include the orientation information and cell types for each of first cell 102A second cell 102B, third cell 102C, and fourth cell 104D.

At block 220 of method 200, bridge pairs are extracted from the received design layout. For example, bridge pairs for neighboring cells, for example, first cell 102A and second cell 102B, are extracted from the received design layout for circuit 100. Extraction of the bridge pairs includes determining boundary nodes of each of the neighboring cells in a base orientation and determining a pairing of the boundary nodes for the neighboring cells. Extraction of the bridge pairs is discussed in greater detail with reference to FIG. 3 below.

At block 230 of method 200, bridge faults from the extracted bridge pair are modeled. For example, the bridge faults in the bridge pairs extracted for neighboring cells, for example, first cell 102A and second cell 102B, are modeled. The bridge faults are modelled at the cell level. For example, the boundary nodes of the bridge pairs are connected to either VDD or the VSS through a resistor bridge. Modeling of the bridge faults is discussed in greater details with reference to FIGS. 7A, 7B, 7C, 7D, 8A, 8B, 9A, 9B, 9C, 9D, 10A, and 10B below.

At block 240 of method 200, a test pattern is generated. The test pattern is generated based on the modeled bridge faults. For example, a defect table is generated for the bridge faults and a test pattern for the ATPG is generated from the defect table. Generation of the test pattern is discussed in greater detail below.

After generating the test pattern at block 240, method 200 proceeds to decision block 250. At decision block 250, it is determined whether the coverage of fault detection is acceptable. An acceptable range for the coverage of the fault detection is predefined, and it may vary based on type of cells of example circuit 100. For example, the acceptable range may be 70-90% for example circuit 100. However, other ranges are within the scope of the disclosure.

If the coverage is not acceptable at the decision block 250, method 200 proceeds to block 260 where a filler cell is inserted between neighboring cells with an undetectable bridge fault. For example, a filler cell with no internal cell elements is inserted between two cells with undetectable bridge pair fault. Insertion of the filler cell is discussed in greater detail with reference to FIG. 11 below.

After the filler cell is inserted between the undetectable bridge pairs at block 260, method 200 proceeds to block 210. However, if the coverage is acceptable at the decision block 250, method 200 ends at block 270.

Figure 3:
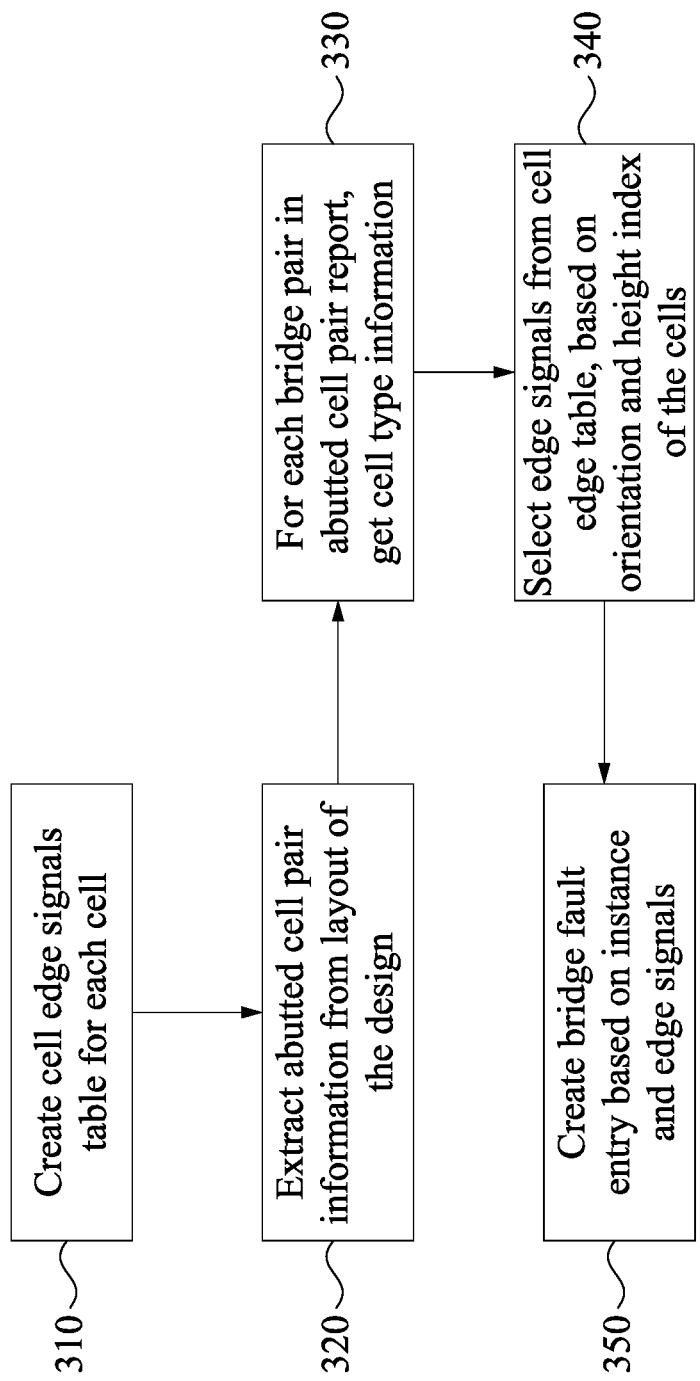
FIG. 3 illustrates a flow diagram of an example method for extracting bridge pairs from neighboring cells in a circuit, in accordance with some embodiments.

FIG. 3 illustrates a flow diagram of a method 300 for bridge pair extraction. For example, method 300 may be implemented for bridge pair extraction of example circuit 100 described with reference to FIG. 1. Method 300 can be implemented using a computing device, for example, computing device described with reference to FIG. 12. Ways to implement method 300 will be described in greater detail below.

At block 310 of method 300, a cell edge signal table is created. The cell edge signal table is created from the GDS. For example, a cell edge table is created for a cell pair, for example first cell 102A and second cell 102B, of circuit 100.

The cell edge table includes a text format to define cell boundary information from bottom to top based on a base orientation.

An example cell edge signal table 400 is illustrated with reference to FIG. 4A. Cell edge signal table 400 may represent, for example, first cell 102A or second cell 102B, which is a single height cell. In example embodiments, a single height cell includes two boundary nodes on a first side and two boundary nodes on a second side. Hence, for a single height cell there may be four boundary nodes. Each boundary node may be associated with a boundary signal. Cell edge signal table 400, therefore, lists details of the four boundary nodes.

Cell edge signal table 400 may be provided in a tabular form having rows and columns. For example, and as shown in FIG. 4A, cell edge signal table 400 includes a first column which includes a cell name, a second column (represented as a left_row_fin_type) which lists boundary nodes in a first side of the cells, and a third column (represented as right_row_fin_type) which lists boundary nodes on a second side of the cell. In addition, cell edge signal table 400 includes a first row listing boundary nodes of first cell 102A and a second row listing boundary nodes of second cell 102B. The entries in cell edge table 400 may include type of node, that is, internal (denoted as INT) and external (denoted as EXT). The entries may further include whether the node is a source node, a drain node, or a power node (VSS or VDD). In example embodiments, cell edge signal table 400 doesn't have to be in order as cells paired in layout, and it can be in any order, and information may be extracted based on cell name from any row in the table.

Figures 4A, 4B:
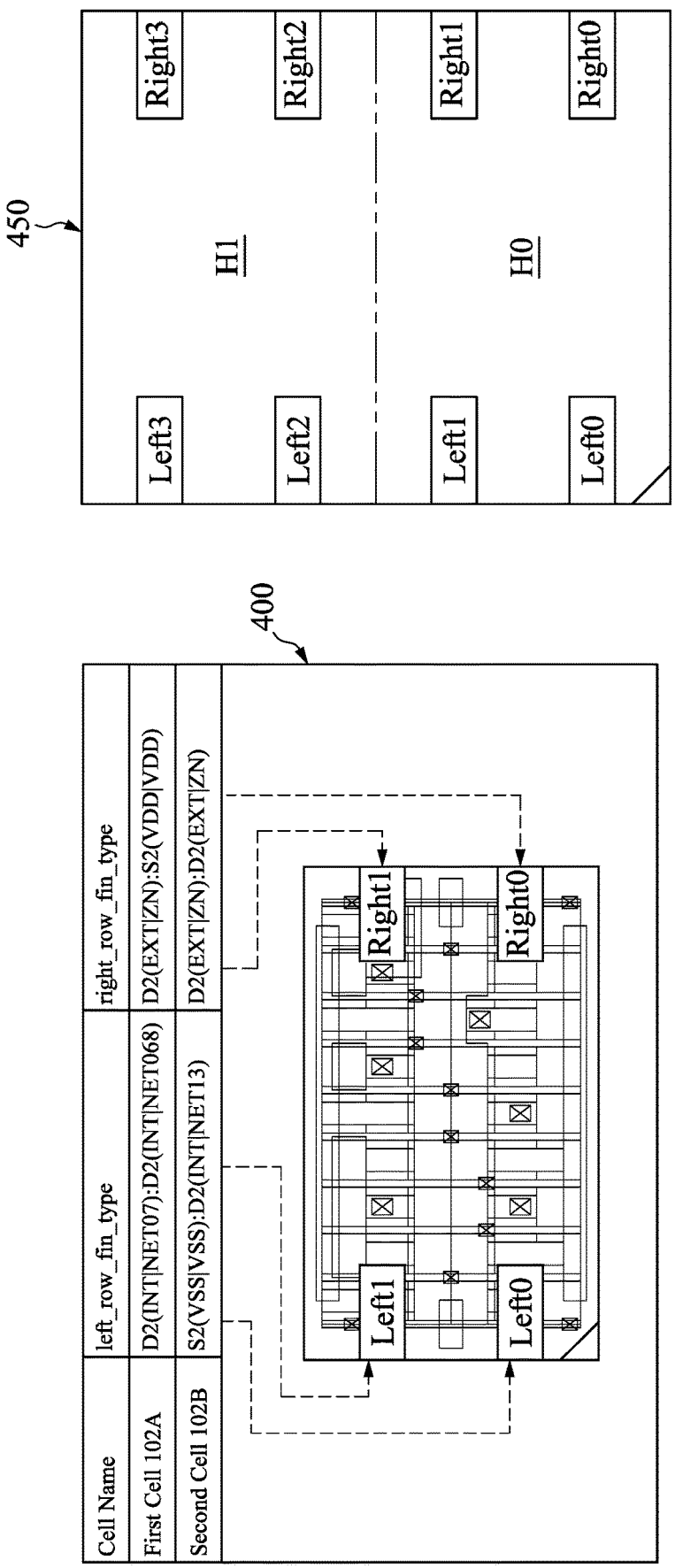
FIG. 4A illustrates an example cell edge table for an example cell of a circuit, in accordance with some embodiments.
FIG. 4B illustrates an example multi-height cell of a circuit, in accordance with some embodiments.

Continuing with FIG. 4A, the left_row_fin_type column lists two entries for signals on the left boundary of first cell 102A and second cell 102B respectively. The first row in the left_row_fin_type column corresponds to Left 1 node and Left 0 node of first cell 102A and the second row in the left_row_fin_type column corresponds to Left 1 node and Left 0 node of second cell 102B. Similarly, the right_row_fin_type column lists two entries for signals on the right boundary. The first entry in the right_row_fin_type column corresponds to Right 0 node and Right 1 node of first cell 102A and the second entry corresponds to Right 0 node and Right 1 node of second cell 102B. These entries in cell edge signal table 400 are used to extract a type of node for each boundary node.

In example embodiments, a number of rows and columns of cell edge signal table 400 depends on a height (represented as Hn) of the cell. FIG. 4B illustrates a layout of a multi-height cell, for example, a double-height cell 450 (represented as H0 and H1). An example cell edge signal table (not shown) for double-height cell 450 of FIG. 4B can include four rows and a total of eight entries, that is, four signals for the left side nodes, for example, Left 0, Left 1, Left 2, and Left 3, and four signals for the right side nodes, for example, Right 0, Right 1, Right 2, and Right 3. In addition, it will be apparent to a person with the ordinary skill in the art after reading this disclosure that a multi-height cell can include more than double height, for example tripper height.

Figure 5A:
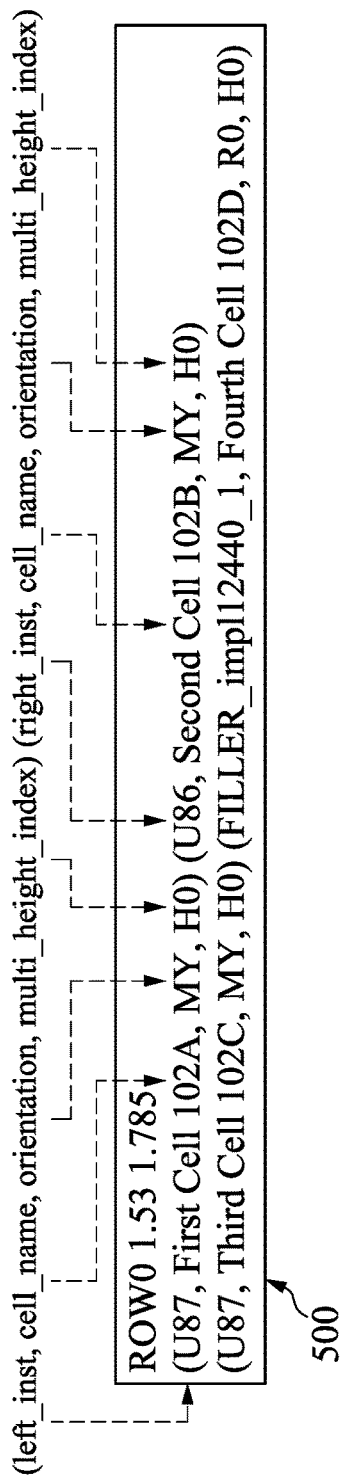
FIG. 5A illustrates an example layout information of cells of a circuit, in accordance with some embodiments.
Figure 5B:
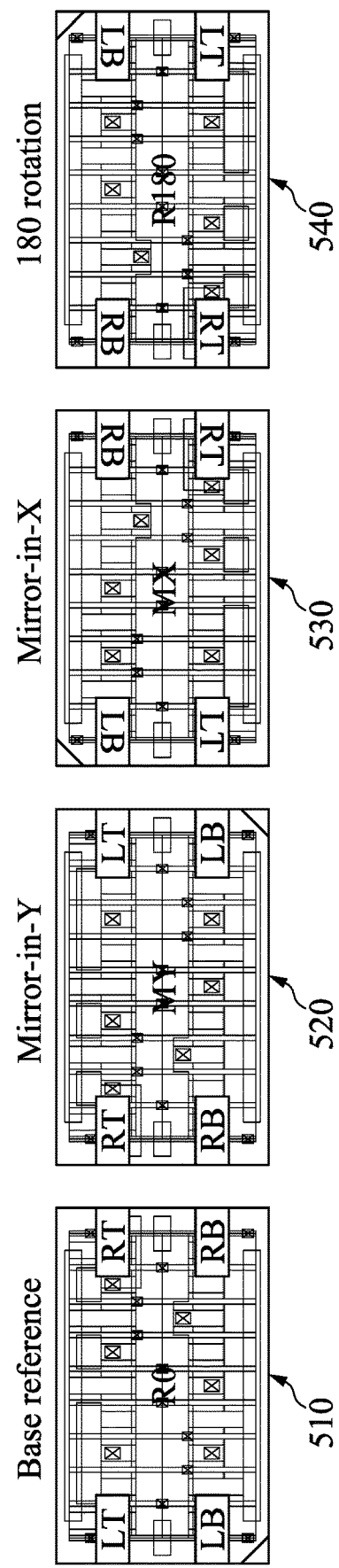
FIG. 5B illustrates example orientations of a cell of a circuit, in accordance with some embodiments.

Referring again to FIG. 3, at block 320 of method 300, abutted cell pair information is extracted. The abutted cell pair information is extracted from a layout report. The abutted cell pair information includes information about the neighboring cell pairs. The information includes a type of the neighboring cell, an orientation of the neighboring cell, etc. An example layout report 500 is shown in FIG. 5A. Layout report 500 includes information on nodes abutting the left side of the current cell and nodes abutting the right side of the current cell. Layout report 500 includes for example, a cell name, an orientation, and a height index of the abutting cells. The cell name may include, for example, that is first cell 102A, second cell 102B, third cell 102C, and a filler fourth cell 102D. The orientation designations, as shown in FIG. 5B, may include, for example, a base reference orientation (represented as R0) 510, a mirror-in-Y orientation (represented as MY) 520, a mirror-in-X orientation (represented as MX) 530, a 180 rotation orientation (represented as R180) 540, among others. A base reference orientation 510 can be predetermined.

At block 330 of method 300, cell type information is determined. The cell type information is determined for each cells of each neighboring cell pair. FIG. 6A illustrates an example cell type information 600. Cell type information 600 includes, for example for a left side cell, a cell instance (represented as U73), a cell name (represented as first cell 102A), an orientation (represented as R180), and a height index (represented as H0). Similarly, cell type information 600 includes, for the right side cell, a cell instance (represented as CS), a cell name (represented as second cell 102B), an orientation (represented as MX), and a height index (represented as H0).

At block 340 of method 300, edge signals from the cell edge table are selected. The edge signals are selected based on an orientation and a height index of the neighboring cells. In example embodiments, the edge signals are selected based on cell type information 600. FIG. 6B illustrates a process for selecting edge signals. For example, and as shown in FIG. 6B, cell edge table 610 for neighboring cells is received. Cell edge table 610 is then processed to compensate for an orientation different from base reference R0 510 orientation. For example, cell edge table 610 is processed to compensate for 180 degrees rotation associated with R180 orientation for the left side cell and for mirror-in-X rotation associated with MX orientation for the right side cell to receive base reference orientation cell edge table 620. Cell edge signals are selected from base reference orientation cell edge table 620. FIG. 6B for example, illustrates orientation of neighboring cells obtained from cell edge table 620. As shown in FIG. 6B, cell edge signals may include signals between a first node of a first cell 102 A (represented as VSS) and a first node of second cell 102B (represented as SEB). In addition, cell edge signals may include signals between a second node of a first cell 102 A (represented as NET 13) and a second node of second cell 102B (also represented as SEB).

At block 350 of method 300, a bridge fault entry is created. The bridge fault entry is created based on instance of the edge signals. The bridge fault entry may include, for example, a cell name and signal type for each bridge fault. FIG. 6C illustrates an example of a bridge fault entry 640. As shown in FIG. 6C, the bridge fault entry 640 includes U73/VSS cs_stall_p2_reg/SEB and U73/NET13 cs_stall_p2_reg/SEB where U73 and cs_stall_p2_Reg represent cell names, and VSS, SEB, and NET 13 represent signal names.

In example embodiments, the identified bridge faults, for example bridge fault entry 640, are modeled to generate an ATPG pattern for the bridge fault. The processes disclosed herein provides modeling of the bridge faults to generate the ATPG pattern for the bridge fault. For example, the processes disclosed herein are implemented to model internal node to internal node and internal node to external node bridge faults. An internal node can either be at logic 0 (VSS) or at logic 1 (VDD). Similarly, the neighboring node can be either be at logic 0 (VSS) or at logic 1 (VDD). Hence, the bridge faults can be represented in four combinations. These combinations of the bridge faults and modeling of these combinations are described in greater detail with reference to FIGS. 7A, 7B, 7C, 7D, 8A, 8B, 9A, 9B, 9C, 9D, 10A, and 10B of the description. Although the combinations of the bridge faults and modeling of these combinations in FIGS. 7A, 7B, 7C, 7D, 8A, 8B, 9A, 9B, 9C, 9D, 10A, and 10B are described with reference to p-type Metal Oxide Semiconductor (PMOS) and n-type Metal Oxide Semiconductor (NMOS) logic transistors, it will be apparent to person with ordinary skill in the art after reading this disclosure that the processes disclosed herein can be used to model bridge fault in other types of cells.

Figure 7A:
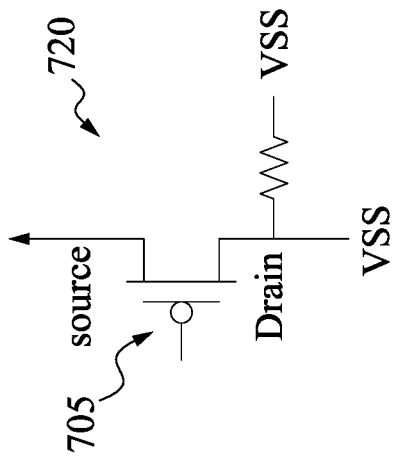
FIGS. 7A, 7B, 7C, and 7D illustrates example combinations for bridge faults for a PMOS cell, in accordance with some embodiments.
Figure 7B:
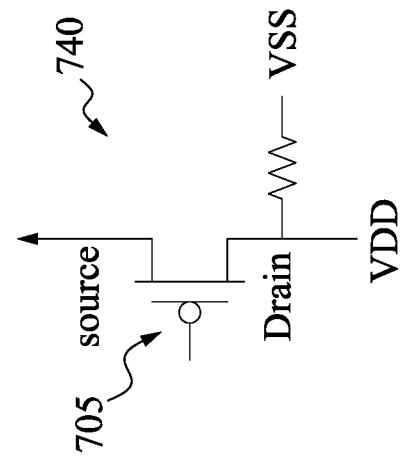
Figure 7C:
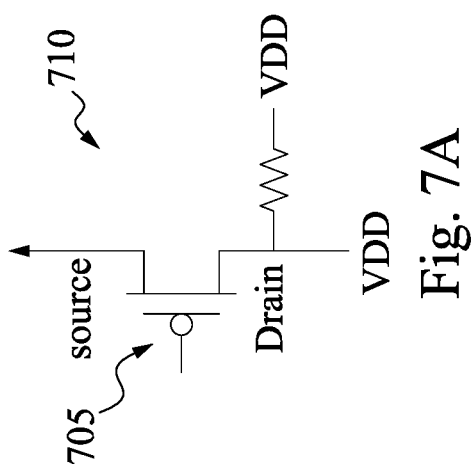
Figure 7D:
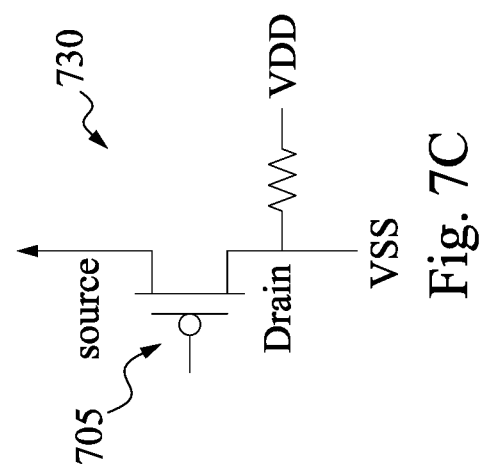

FIGS. 7A, 7B, 7C, and 7D illustrates different combinations for a bridge fault for a PMOS transistor 705. For example, and as shown in FIG. 7A, in a first scenario 710, the internal node (drain) of PMOS transistor 705 is at logic 1 (VDD) and the neighboring node is also at logic 1 (VDD). In a second scenario 720, as shown in FIG. 7B, the internal node of PMOS transistor 705 is at logic 0 (VSS) and neighboring node is also at logic 0 (VSS). In a third scenario 730, as shown in FIG. 7C, the internal node of PMOS transistor 705 is at logic 0 (VSS) and the neighboring node is at logic 1 (VDD). In a fourth scenario 740, as shown in FIG. 7D, the internal node of PMOS transistor 705 is at logic 1 (VDD) and the neighboring node is at logic 0 (VSS). The source of a PMOS transistor is generally connected to logic 1 (VDD). Hence, in each of first scenario 710, second scenario 720, third scenario 730, and fourth scenario 740, the source of PMOS transistor 705 is connected to logic 1 (VDD).

In example embodiments, in first scenario 710 where both the internal node and the neighboring node are at logic 1 (i.e. an approximately equal potential), there is no current flow through the bridge fault. Hence, the bridge fault in first scenario 710 does not affect working of either of the neighboring cells as shown in FIG. 5B. Similarly, in second scenario 720 where both the internal node and the neighboring node are at logic 0, there is no current flow through the bridge fault. Therefore, the bridge fault in second scenario 720 does not affect the working of either of neighboring cells. Hence, the bridge faults of first scenario 710 and second scenario 720 are not modeled. Moreover, the bridge faults of first scenario 710 and second scenario 720 are generally covered under standard ATPG patterns, and hence may not need additional modeling.

However, in third scenario 730 and fourth scenario 740 both the internal node and neighboring nodes are at different logic levels. In these cases, a flow of current through the bridge fault may occur and affect functionality of one or both neighboring cells. Therefore, third scenario 730 and fourth scenario 740 are modeled to generate an ATPG pattern.

FIG. 8A illustrates a model for third scenario 730 described with reference to FIG. 7C. For example, in case of third scenario 730, because the neighboring node is at logic 1 and the internal node is at logic 0, there is possibility of a current flow from the neighboring node to the internal node (arrow 812). Hence, third scenario 730, and as shown in FIG. 8A, is modeled as a first model 810 which includes the internal node (drain) of PMOS transistor 705 being connected to logic 1 (VDD) via a resistor R. A value of the resistor R is in a range of 1 ohm to 10 kilo ohms. However, other ranges are within the scope of the disclosure. In addition, since there is no current from the source to the drain, PMOS transistor 705 may be modeled as a conductor (not shown) with no current.

FIG. 8B illustrates a model of the fourth scenario described with reference to FIG. 7D. In case of bridge fault in the fourth scenario, because the neighboring node is at logic 0 and the internal node is at logic 1, there is a possibility of a current flow from the internal node to the neighboring cell node (arrow 822). Hence, the fourth scenario is modeled as a second model 820 which includes connecting the internal node (drain) of PMOS transistor 705 to logic 0 (VSS) via a resistor R. The value of the resistor R is in a range of 1 ohm to 10 kilo ohms. In addition, since there is no current from the source to the drain, PMOS transistor 705 may be modeled as a conductor (not shown) with no current.

Figure 9B:
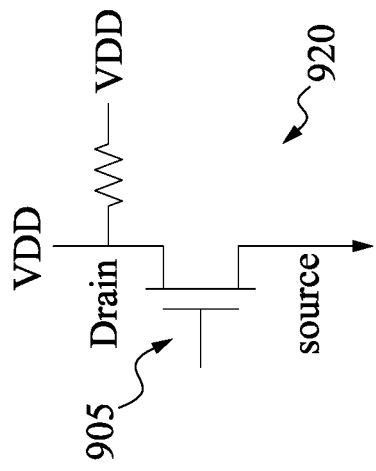
FIGS. 9A, 9B, 9C, and 9D illustrates example combinations of for the bridge faults for a NMOS cell, in accordance with some embodiments.
Figure 9D:
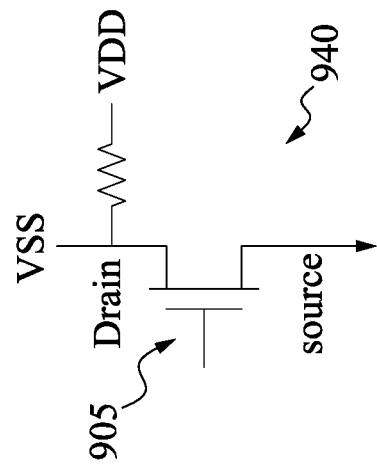
Figure 9A:
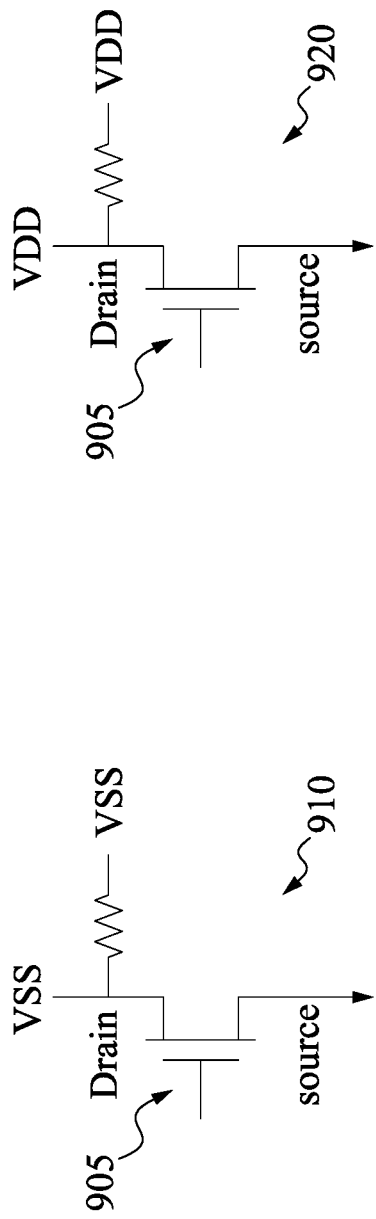
Figure 9C:
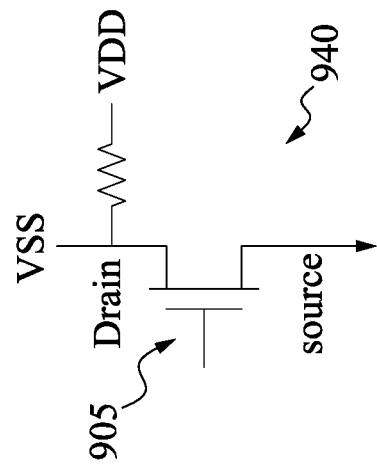

FIGS. 9A, 9B, 9C, and 9D illustrates different combinations for a bridge fault for a NMOS transistor 905. For example, and as shown in FIG. 9A, in a fifth scenario 910, the internal node (drain) of NMOS transistor 905 is at logic 0 (VSS) and the neighboring node is also at logic 0 (VSS). FIG. 9B illustrates a sixth scenario 920 in which the internal node of NMOS transistor 905 is at logic 1 (VDD) and the neighboring node is also at logic 1 (VDD). Moreover, FIG. 9C illustrates a seventh scenario 930 in which the internal node of NMOS transistor 905 is at logic 1 (VDD) and the neighboring node is at logic 0 (VSS). In addition, FIG. 9D illustrates an eighth scenario 940 in which the internal node of NMOS transistor 905 is at logic 0 (VSS) and the neighboring node is at logic 1 (VDD). A source of a NMOS transistor is generally connected to logic 0 (VSS). Hence, in each of fifth scenario 910, sixth scenario 920, seventh scenario 930, and eighth scenario 940, the source of NMOS transistor 905 is connected to logic 0 (VSS).

In example embodiments, in fifth scenario 910, both the internal node and the neighboring node in the bridge fault are at logic 0. So current flow through the bridge fault may not occur. Hence, the bridge fault in fifth scenario 910 may not affect functioning of either neighboring cells. In sixth scenario 920 both the internal node and the neighboring node are at logic 1, and current does not flow through the bridge fault. Therefore, the bridge fault in the sixth scenario 920 does not affect either of neighboring cells. Since neighboring cells are not affected, the bridge faults of fifth scenario 910 and sixth scenario 920 are not modeled. Moreover, the bridge faults of fifth scenario 910 and sixth scenario 920 are generally covered under standard ATPG patterns, and hence may not need additional modeling.

However, in seventh scenario 930 and eight scenario 940 both neighboring nodes of the bridge fault are at different logic levels and hence the bridge fault can cause a flow of current between the nodes through the bridge fault and affect the functionality of both neighboring cells. Therefore, seventh scenario 930 and eighth scenario 940 are modeled to generate an ATPG test pattern.

FIGS. 10A and 10B illustrate modeling for the seventh and the eighth scenarios. For example, FIG. 10A illustrates a model 1010 for seventh scenario 930 described with reference to FIG. 9C. In this case, since the neighboring node is at logic 0 and the internal node is at logic 1, there is a possibility of a current flow (illustrated at arrow 1012) from the internal node to the other node. Hence, model 1010 for seventh scenario 930 is modeled as the internal node (i.e., drain) of NMOS transistor 905 being connected to logic 0 (VSS) via a resistor R. The value of the resistor R is approximately in a range of 1 ohm to 10 kilo ohms.

FIG. 10B illustrates a model 1020 for eighth scenario 940 described with reference to FIG. 9D. In case of bridge fault in eighth scenario 940, because the neighboring node is at logic 1 and the internal node is at logic 0, there is a possibility of a current flowing from the neighboring node to the internal node (arrow 1022). Hence, model 1020 for the eighth scenario 940 includes the internal node (i.e., drain) of NMOS transistor 905 connected to logic 1 (VDD) via a resistor R. The value of the register R is approximately in a range of 1 ohm to 10 kilo ohms. However, other ranges are within the scope of the disclosure.

In example embodiments, a defect table is generated for the bridge fault. The defect table, for example, is generated via a simulation of modeled faults. The defect table is generated for a defect of interest, for example, a static defect or a dynamic defect. For simulation, a simulation model, also referred to as a netlist, of the cell is generated. The simulation model for the cell may include electrical characteristics, for example, resistance, capacitance, wire delays, etc. The simulation model is then modified to connect the boundary node to logic 1 or logic 0 via a resistor R representing the bridge fault. The modified model is then used for simulation to determine the defects associated with the bridge fault by varying a value of the resistor R.

In example embodiments, the value of resistor R is varied between 1 ohm and 10 mega ohms by increasing it by a predetermined value for each simulation to determine a defect of interest. For example, at a resistance value of 1.0 ohm a static defect may be observed indicating a change in the value of the output from an expected output. In another example, at a resistance value of 1000 ohms, a dynamic defect with a delay of 10 Pico seconds which may be observed. The dynamic defect indicates a delay in the output from an expected output. A defect table then may be generated for the defect of interest. The defect table may include sample input values which may be a plurality of bits (that is 0s and 1s). The defect table may further include sample output values corresponding to the input values to observe the defect. The output values may include a plurality of bits (that is 0s and 1s) or a delay time.

The defect table is used to generate a test pattern, for example, an ATPG pattern for the defect. The generated pattern may include input values and an expected output corresponding to the input values. The generated pattern is used to determine defect in circuit 100.

Figure 11:
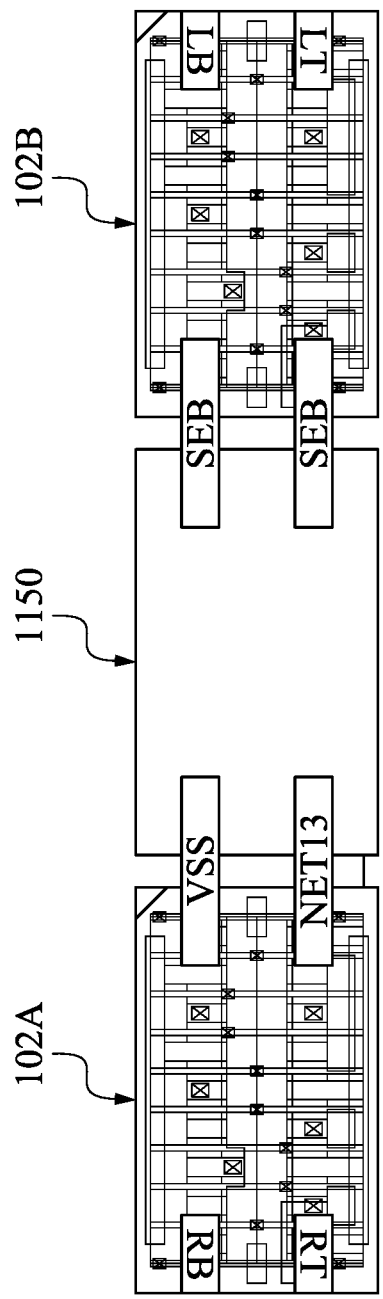
FIG. 11 illustrates an example of a filler cell between neighboring cells of a circuit, in accordance with some embodiments.

In example embodiments if the coverage for the ATPG is below a pre-determined level, the bridge fault is replaced with a filler cell. For example, if the coverage for the ATPG is below 90% or is below a predetermined number then the bridge fault is replaced with a filler cell. FIG. 11 illustrates a filler cell 1150 placed between first cell 102A and second cell 102B. As shown in FIG. 11, filler cell 1150 does not include any functional connections inside the cell. Filler cell 1150, thus, avoids bridge fault between first cell 102A and second cell 102B.

Figure 12:
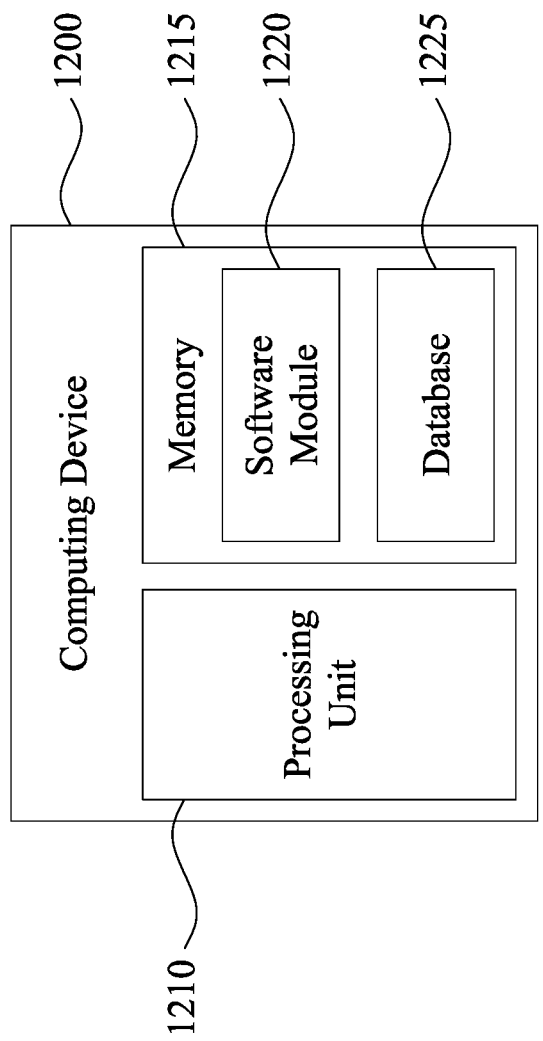
FIG. 12 illustrates an example computing device, in accordance with some embodiments.

FIG. 12 illustrates an example computing device 1200. As shown in FIG. 12, computing device 1200 includes a processing unit 1210 and a memory unit 1215. Memory unit 1215 includes a software module 1220 and a database 1225. While executing on processing unit 1210, software module 1220 performs, for example, processes for detecting defects in circuits, for example circuit 100, which includes advance process nodes, including for example, any one or more of the stages from methods 200 and 300 described above with respect to FIGS. 2 and 3 respectively.

Computing device 1200 is implemented using a tablet device, a mobile device, a smart phone, a telephone, a remote control device, a personal computer, a network computer, a mainframe, a server cluster, a smart TV-like device, a network storage device, a network relay devices, or other similar microcomputer-based device. Computing device 1200 includes any computer operating environment, such as hand-held devices, multiprocessor systems, microprocessor-based or programmable sender electronic devices, minicomputers, mainframe computers, and the like. Computing device 1200 may also be practiced in distributed computing environments where tasks are performed by remote processing devices. The aforementioned systems and devices are examples and computing device 1200 may comprise other systems or devices.

In example embodiments, a method comprises: receiving a layout of a circuit, the layout comprising a first cell and a second cell separated by a boundary circuit; determining bridge pairs for the circuit, the bridge pairs comprising a first plurality of boundary nodes of the first cell paired with a second plurality of boundary nodes of the second cell; modeling bridge pair faults between the bridge pairs; and generating a pattern for the bridge pair faults.

In embodiments, an apparatus comprises a memory storage; and a processing unit coupled to the memory storage, wherein the processing unit is operative to: receive a layout of a circuit, the layout comprising placement information of a plurality of cells of the circuit; identify a first cell and a second cell from the layout, the second cell abutting the first cell and separated from the first cell by a boundary circuit; determining bridge pairs between the first cell and the second cell, the bridge pairs comprising a first plurality of boundary nodes of the first cell paired with a second plurality of boundary nodes of the second cell; model bridge pair faults between the bridge pairs; and generate a test pattern for the bridge pair faults.

In example embodiments, a computer-readable medium that stores a set of instructions when executed perform a method executed by the set of instructions comprising: receiving a layout of a circuit, the layout comprising a position and an orientation of a plurality of cells of the circuit; determining bridge pairs between neighboring cells of the plurality of cells of the circuit, the bridge pairs comprising a first plurality of boundary nodes paired with a second plurality of boundary nodes, wherein determining the bridge pairs comprises: determining a first cell and a second cell abutting the first cell, determining a cell layout for each of the first cell and the second cell, determining a base orientation for each of the first cell and the second cell from the cell orientation, and determining, from the base orientation, the first plurality of boundary nodes of the first cell facing one of the second plurality of boundary nodes of the second cell; modeling bridge pair faults between the bridge pairs; and generating a test pattern for the bridge pair faults.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC). Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components of computing device 400 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a layout of a circuit, the layout comprising a first cell and a second cell separated by a boundary circuit;
   determining bridge pairs for the circuit, the bridge pairs comprising a first plurality of boundary nodes of the first cell paired with a second plurality of boundary nodes of the second cell;
   connecting one of the first plurality of boundary nodes to a pre-determined potential to model bridge pair faults between the bridge pairs; and
   generating a test pattern for the bridge pair faults.

2. The method of claim 1, further comprising determining a fault coverage of the circuit from the test pattern.

3. The method of claim 2, further comprising inserting, in response to determining that the fault coverage is less than a predetermined level, a filler cell between the first cell and the second cell.

4. The method of claim 3, further comprising determining the bridge pairs for the circuit with the inserted filler cell.

5. The method of claim 1, wherein modeling the bridge pair faults between the bridge pairs comprises modelling the bridge pair faults between internal node to internal node bridge pairs.

6. The method of claim 1, wherein modeling the bridge pair faults between the bridge pairs comprises modelling the bridge pair faults between internal node to external node bridge pairs.

7. The method of claim 1, wherein modeling the bridge pair faults between the bridge pairs comprises modelling the bridge pair faults as individual cell level faults.

8. The method of claim 1, wherein generating the test pattern for the bridge pair faults comprises generating an input pattern and an expected output for the input pattern for each of the bridge pair faults.

9. The method of claim 1, wherein modeling the bridge pair faults between the bridge pairs comprises modelling dynamic faults in the bridge pairs.

10. A non-transitory computer-readable medium that stores a set of instructions when executed perform a method, the method comprising:
    receiving a layout of a circuit, the layout comprising a position and an orientation of a plurality of cells of the circuit;
    determining bridge pairs between neighboring cells of the plurality of cells of the circuit, the bridge pairs comprising a first plurality of boundary nodes paired with a second plurality of boundary nodes, wherein determining the bridge pairs comprises:
    determining a first cell and a second cell abutting the first cell,
    determining a cell layout for each of the first cell and the second cell,
    determining a base orientation for each of the first cell and the second cell from the cell orientation, and
    determining, from the base orientation, the first plurality of boundary nodes of the first cell facing one of the second plurality of boundary nodes of the second cell;
    modeling bridge pair faults between the bridge pairs; and
    generating a test pattern for the bridge pair faults.

11. The non-transitory computer-readable medium of claim 10, wherein each of the first plurality of boundary nodes and the second plurality of boundary nodes comprises at least one of an internal node, an external node, a power ground node, and an input/output node.

12. The non-transitory computer readable medium of claim 11, wherein modeling the bridge pair faults between the bridge pairs comprises modeling the bridge pair faults between at least one of internal node to internal node bridge pairs and internal node to external node bridge pairs.

13. The non-transitory computer readable medium of claim 11, wherein modeling the bridge pair faults between the bridge pairs comprises modeling the bridge pair faults at the first cell level.

14. An apparatus comprising:
    a memory storage; and
    a processing unit coupled to the memory storage, wherein the processing unit is operative to:
    receive a layout of a circuit, the layout comprising a first cell and a second cell separated by a boundary circuit;
    determine a bridge pair for the circuit, the bridge pair comprising a first boundary node of the first cell paired with a second boundary node of the second cell;
    connect the first boundary node to a pre-determined potential to model a bridge pair fault between the bridge pair; and
    generate a test pattern for the bridge pair fault.

15. The apparatus of claim 14, wherein the processing unit is further operative to determine a fault coverage of the circuit from the generated test pattern.

16. The apparatus of claim 15, wherein the processing unit is further operative to insert, in response to determining that the fault coverage is less than a predetermined level, a filler cell between the first cell and the second cell.

17. The apparatus of claim 16, wherein the processing unit is further operative to determine the bridge pair for the circuit with the inserted filler cell.

18. The apparatus of claim 14, wherein the processing unit being operative to model the bridge pair fault between the bridge pair comprises the processing unit being operative to model the bridge pair fault between an internal node to internal node bridge pair.

19. The apparatus of claim 14, wherein the processing unit being operative to model the bridge pair fault between the bridge pair comprises the processing unit being operative to model the bridge pair fault between an internal node to external node bridge pair.

20. The apparatus of claim 14, wherein the processing unit being operative to model the bridge pair fault between the bridge pair comprises the processing unit being operative to model the bridge pair fault as an individual cell level fault.

* * * * *